United States Patent
Shibuya et al.

(10) Patent No.: US 6,466,124 B1
(45) Date of Patent: Oct. 15, 2002

(54) THIN FILM RESISTOR AND METHOD FOR FORMING THE SAME

(75) Inventors: Akinobu Shibuya; Koji Matsui, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/546,334

(22) Filed: Apr. 10, 2000

(30) Foreign Application Priority Data

Apr. 8, 1999 (JP) .......................................... 11-101472

(51) Int. Cl.$^7$ .............................................. H01C 1/012
(52) U.S. Cl. .................... 338/308; 338/309; 252/517.2; 252/520.21
(58) Field of Search ................................ 338/307, 308, 338/309, 20, 21, 315, 322, 333; 252/517.12, 520.21

(56) References Cited

U.S. PATENT DOCUMENTS

| | | | | |
|---|---|---|---|---|
| 4,737,757 A | * | 4/1988 | Senda et al. ................. 338/308 |
| 4,804,636 A | * | 2/1989 | Groover, III et al. .......... 437/52 |
| 4,931,411 A | * | 6/1990 | Tigelaar et al. .............. 437/192 |
| 4,990,997 A | * | 2/1991 | Nishida ........................ 357/71 |
| 5,142,263 A | * | 8/1992 | Childers et al. .............. 338/21 |
| 5,485,333 A | * | 1/1996 | Yang et al. ................... 360/113 |
| 5,496,762 A | * | 3/1996 | Sandhu et al. ................ 437/60 |
| 5,645,900 A | * | 7/1997 | Ong et al. .................... 427/571 |
| 5,723,382 A | * | 3/1998 | Sandhu et al. ............... 438/653 |
| 5,830,563 A | | 11/1998 | Shimoto et al. |
| 5,851,680 A | * | 12/1998 | Heau ........................... 428/472 |
| 5,870,121 A | * | 2/1999 | Chan ........................... 347/59 |
| 6,017,789 A | * | 1/2000 | Sandhu et al. ............... 438/240 |
| 6,028,359 A | * | 2/2000 | Merchant et al. ............ 257/750 |
| 6,087,261 A | * | 7/2000 | Nishikawa et al. .......... 438/685 |

FOREIGN PATENT DOCUMENTS

| | | |
|---|---|---|
| JP | 60-81048 | 5/1985 |
| JP | 61-148732 | 7/1986 |
| JP | 63-156341 | 6/1988 |
| JP | 3-276755 | 12/1991 |
| JP | 4-45536 | 2/1992 |
| JP | 4-174590 | 6/1992 |
| JP | 5-85776 | 4/1993 |
| JP | 5-114581 | 5/1993 |
| JP | 6-85100 | 3/1994 |
| JP | 7-34510 | 4/1995 |
| JP | 7-57905 | 6/1995 |
| JP | 7-263359 | 10/1995 |
| JP | 7-291668 | 11/1995 |
| JP | 9-214141 | 8/1997 |
| JP | 11-354303 | 12/1999 |
| JP | 2000-13016 | 1/2000 |

OTHER PUBLICATIONS

Kumar, et al., "Growth and properties of radio frequency reactively sputtered titanium nitride thin films", J. Vac. Sci. Technol. A5(4), Jul./Aug. 1987, pp. 1778–1782.

Shuichi Kanamori, "Investigation of Reactively Sputtered TiN Films For Diffusion Barriers", pp. 97–102, 1985.

* cited by examiner

Primary Examiner—Elvin Enad
Assistant Examiner—Kyung S. Lee
(74) Attorney, Agent, or Firm—McGinn & Gibb, PLLC

(57) ABSTRACT

There is provided a thin film resistor formed of titanium nitride containing oxygen in a solid solution condition.

15 Claims, 4 Drawing Sheets

THIN FILM RESISTOR AND METHOD FOR FORMING THE SAME

BACKGROUND OF THE INVENTION

The present invention relates to a thin film resistor and a circuit board internally including a thin film resistor, and more specifically to a method for forming a thin film which constitutes a built-in thin film resistor.

Recently, a demand for miniaturization of a mounting board is increasing, so that interconnections are microminiaturized and a circuit density is elevated. On the other hand, reports of the miniaturization of the mounting board attained by internally having a built-in resistor in the mounting board are increasing. A structure of the mounting board having a built-in resistor is classified into a board internally including a chip resistor, a board internally including a thick film resistor, and a board internally including a thin film resistor. The a board internally including the chip resistor has a limitation in miniaturization, and on the other hand, in the board internally including the thick film resistor, precision of a resistance value cannot be elevated.

The board internally including the thin film resistor, called a "thin film resistor built-in board" hereinafter, is the most suitable to miniaturization, and the precision of the resistance value can be elevated to a relatively high level. As a resistor material used in the thin film resistor built-in board, JP-04-174590-A, JP-06-085100-A and JP-07-034510-B propose a Nichrome alloy, a tantalum nitride, ITO (Indium Tin Oxide) and metal silicide. However, when these materials are used, if the resistor material is patterned by a wet etching, the mounting board is subjected to damage, since a strong acid is used for the wet etching. On the other hand, if the resistor material is patterned by a dry etching, a forming process becomes long. In addition, in certain kind of resistor material, it is difficult to selectively etch a resistor and a wiring conductor and an electrode, even by the wet etching.

JP-63-156341-A proposes to use a thin film of titanium nitride as a contact barrier in a semiconductor device. JP-03-276755-A discloses a method for fabricating a semiconductor device, which uses the titanium nitride as a barrier metal and also as a resistor in the semiconductor device.

In the case of using the titanium nitride as the resistor material, a thin film of polycrystalline titanium nitride is used. In addition, resistivity of the thin film of polycrystalline titanium nitride is on the order of 20 to 25 $\mu\Omega\cdot$cm at a small value to )1300 $\mu\Omega\cdot$cm at a large value, which are reported in J. Vac. Sci. Technol. A5, p1778 (1987) and Semiconductor Integrated Circuit Technology Symposium Transactions, 28, p97 (1985). In other words, it is difficult to form a high resistance thin film. In addition, a temperature coefficient of resistance was adversely large.

JP-61-148732-A shows an example of a temperature sensor resistor formed of amorphous metal nitride such as TiN and TaN formed by a high frequency magnetron sputtering. However, this resistor is not suitable for an ordinary circuit resistor such as a terminating resistor, because the resistance value greatly varies dependently upon a temperature change.

In Japanese Patent Application No. Heisei 10-165122 which was published as JP-11-354303-A, the co-inventors of this application propose a thin film resistor formed of crystalline titanium nitride and amorphous titanium nitride, which is excellent in characteristics as a resistor and which can assume a resistance value of a wide range, by controlling a forming condition. However, the resistance of this thin film resistor adversely increases when it is subjected to a thermal hysteresis. Therefore, this thin film resistor is not suitable as a resistor which is required to have a high precision as a resistor for a time constant circuit.

On the other hand, a compound composed of titanium, nitrogen and oxygen is proposed in JP-07-263359-A, JP-05-114581-A, JP-04-045536-A, JP-07-291668-A, JP-05-085776-A, JP-60-081048-A and JP-07-057905-B. JP-07-263359-A discloses a method for forming a barrier layer of TiOxNy by an ECR (electronic cyclotron resoniance) plasma CVD (chemical vapor deposition) process. JP-05-114581-A shows a method for forming a refractory metal oxynitride film (TiON) as a barrier layer on a refractory metal nitride film (TiN) by a CVD process.

JP-04-045536-A proposes a copper interconnection film composed of a copper thin film formed on an antioxidation film of a conducting material containing no oxygen, formed on a barrier metal formed of a titanium oxynitride (TiON) film. JP-07-291668-A shows a radio wave transparent type heat ray shielding glass composed of a first layer of tin oxide or tin oxynitride formed on a glass plate, a thin film of titanium oxynitride film coated on the first layer, and a second layer of tin oxide or tin oxynitride formed on the thin film of titanium oxynitride film. JP-05-085776-A discloses a radio wave low-reflection colored glass composed of a transparent colored glass, a first layer coated on the transparent color glass and formed of a TiNO film or a composite thin film including TiNO as a main component, and a second layer coated on the first layer and formed of a TiON film or a composite thin film including TiON as a main component. JP-60-081048-A shows a titanium nitride thin film coated glass composed of a titanium oxide ($TiO_2$) layer, a buffer layer of titanium oxide and titanium nitride (TiN), a titanium nitride layer deposited on a surface of a glass plate in the named order. JP-07-057905-B discloses an ornament including a coating layer of Ti(NxOy)z (where $0.005 \leq y \leq 0.060$, x=1-y, $0.8 \leq z \leq 1.0$) between a substrate and an uppermost layer. None of the above referred patent publications uses the compound composed of titanium, nitrogen and oxygen, as a material for a thin film resistor,

BRIEF SUMMARY OF THE INVENTION

Accordingly, it is an object of the present invention to provide a thin film resistor which has overcome the above mentioned problems of the prior art.

Another object of the present invention is to provide a thin film resistor which can be simply patterned by a wet etching.

Still another object of the present invention is to provide a thin film resistor which has an excellent thermal stability and a high precision of resistance value.

A further object of the present invention is to provide a thin film resistor which has an excellent temperature characteristics of resistance.

A still further object of the present invention is to provide a substrate internally including a thin film resistor as mentioned above.

A further object of the present invention is to provide a thin film resistor material which can assume a resistance value of a wide range by controlling a forming condition, and a method for forming a thin film resistor.

The above and other objects of the present invention are achieved in accordance with the present invention by a thin film resistor formed of a thin film of titanium nitride containing oxygen in a solid solution condition.

According to another aspect of the present invention, there is provided a substrate internally including a resistor which is constituted of a thin film resistor formed of a thin film of titanium nitride containing oxygen in a solid solution condition According to still another aspect of the present invention, there is provided a method for forming a thin film resistor formed of titanium nitride containing oxygen in a solid solution condition, wherein a thin film of titanium nitride containing oxygen in a solid solution condition is deposited by a reactive-sputtering using a titanium target and a process gas composed of a mixed gas including at least a nitrogen gas and a gas which contains an oxygen element.

According to a further aspect of the present invention, there is provided a method for forming a thin film resistor formed of titanium nitride containing oxygen in the solid solution condition, wherein a thin film of titanium nitride containing oxygen in a solid solution condition is deposited on a water-deposited substrate by a reactive-sputtering using a titanium target and a process gas including at least a nitrogen gas.

With the above mentioned arrangement, the thin film resistor in accordance with the present invention formed of the thin film of titanium nitride containing oxygen in the solid solution condition, can be patterned by a wet etching with a high degree of precision in dimension. Therefore, it is possible to shorten the fabricating process so as to lower a production cost, and also to elevate the precision of the resistance value. Because of the oxygen contained in the solid solution condition, a heat-resistance of the thin film is elevated, so that the change in resistance value caused by a thermal hysteresis can be minimized.

Furthermore, since an etchant used at the time of patterning the thin film resistor by the wet etching does not deteriorate a substrate, it is possible to fabricate a substrate internally including the thin film resistor in accordance with the present invention.

In addition, the thin film resistor is required to be able to assume a resistivity value of a wide range,. For example, in order to have a resistance value of 50Ω, it is sufficient if a material having the resistivity of 0.1 mΩ·cm is patterned to have a thickness of 20 nm and a width and a length which are equal to each other. On the other hand, if the resistor patterned to have the same dimensions as those mentioned above, is formed of a material having the resistivity of 100 mΩ·cm, the resistor can have the resistance value of 50 kΩ.

By changing the dimensions, it is possible to adjust the resistance value. However, it can be generally said that, if the thin film is too thin in thickness, a defect occurs in the thin film, or alternatively, the nature of the film changes under influence of a surface structure. On the other hand, if the thickness is increased, the time required for forming the film adversely becomes long, and in addition, the film becomes apt to peal off from a substrate because of an increased internal stress in the film. Furthermore, it is not preferred to change the ratio of the width and the length, from the viewpoint of miniaturization of the resistor. It was an ordinary practice to realize various resistance values in a required range by using different resistive materials. However, the thin film resistor in accordance with the present invention can assume a resistance value in a wide range by controlling the amount of oxygen in a solid solution condition while using one target.

Furthermore, it is also possible to control the temperature coefficient of resistance in the thin film resistor in accordance with the present invention, by controlling the amount of oxygen in a solid solution condition. The amount of oxygen in a solid solution condition can be controlled in a reactive sputtering for forming the thin film resistor, by controlling the flow rate of a gas which contains the oxygen, or alternatively the partial pressure of a gas which contains the oxygen, or the partial pressure of water vapor in a sputtering chamber.

The above and other objects, features and advantages of the present invention will be apparent from the following description of preferred embodiments of the invention with reference to the accompanying drawings.

DETAILED DESCRIPTION OF THE INVENTION

Figure 1:
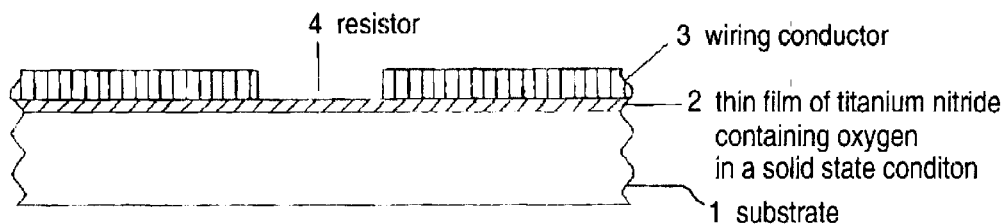
FIG. 1 is a diagrammatic sectional view of a first embodiment of the thin film resistor in accordance with the present invention which is formed of a thin film of titanium nitride containing oxygen in a solid solution condition and which is formed on a substrate.

Now, embodiments of the thin film resistor in accordance with the present invention will be described in detail.

A thin film of titanium nitride can be easily patterned by a wet etching. However, when the thin film of titanium nitride is used for forming a resistor, the thin film of titanium nitride has problems that the temperature coefficient of resistance is large and the range of obtained resistance value is narrow. The reason for this is that, since a polycrystalline thin film of what is stoichiometrically expressed by TiN was formed in the prior art, a resistance characteristics of the thin film is governed by the temperature coefficient of resistance and the resistivity which are intrinsic to TiN. Furthermore, when the thin film of titanium nitride is subjected to a thermal hysteresis, the resistance value adversely greatly changes. This is observed in a thin film resistor formed of amorphous titanium nitride and crystalline titanium nitride. The reason for this is considered that a surface of the thin film resistor and a boundary between the thin film resistor and the substrate.

The co-inventors of this application fabricated thin film resistors formed of a thin film of titanium nitride containing oxygen in a solid solution condition, and found out that, by controlling the amount of the oxygen in the solid solution condition contained in the thin film resistor, it is possible to change the resistance value in a wide range, and also it is possible to control the temperature coefficient of resistance to a preferable value in the range of ±100 ppm/degree Celsius.

The thin film resistor is preferred to have the composition expressed by $Ti(N_{1-x/2}O_x)y$ (where $0<x \leq 0.5$, and $0.8 \leq y \leq 1.4$), although it is in no way limited to only this composition. The reason for this is that: Within this range of composition, the larger the oxygen amount "x" is, the etching time becomes long, but a good wet etching property similarly to TiN can be obtained.

Furthermore, in this range of composition, the change of the resistance value after heat treatment is extremely small. Particularly, in the case of $x \leq 0.2$, the elevation of the resistance of the thin film resistor is not greater than 0.5% after a heat treatment is conducted at 150 degrees Celsius for one hour, and is not greater than 5% after a heat treatment is conducted at 685 degrees Celsius for one hour. This can be considered to mean that the thin film resistor expressed by the above mentioned chemical formula is very stable so that in the heat treatment the thin film is hardly subjected to oxidation or impurity diffusion from the substrate.

The microstructure of the thin film is not limited, but is preferred to be amorphous, a mixed condition of crystal and amorphousness, polycrystalline or a single crystal. The reason for this is that, when the heat treatment is carried out for the thin film resistor having the above mentioned microstructure, oxidation generated in the heat treatment is hardly to advance into the inside of the thin film resistor from the surface of the thin film resistor or the boundary between the thin film resistor and the substrate.

In this connection, when the thin film resistor having the above mentioned range of composition was heat-treated at 825 degrees Celsius for crystallization or grain growth, only the crystal having an X-ray diffraction pattern similar to that of a cubic TiN, was precipitated, but oxide, oxynitride, titanium nitride having a different ratio of Ti and N, and titanium (Ti) were not precipitated. From this fact, it was confirmed that oxygen exists in a solid solution condition in titanium nitride.

The thin film resistor in accordance with the present invention can be advantageously used in place of a chip resistor which are conventionally used on a mounting board. In this case, the thin film resistor in accordance with the present invention can be formed on a surface of the mounting board or within the mounting board. The mounting board can be exemplified by a silicon substrate coated with an insulating layer, a printed circuit board, a built-up substrate an organic film substrate, a ceramic substrate, a glass-ceramic substrate, a glass substrate, a metal substrate coated with an insulating layer, or a metal foil coated with an insulating layer. Furthermore, the mounting board can be a multilayer substrate, in which a plurality of organic insulator layers are formed on a basic substrate. In this case, the thin film resistor can be formed on a surface of the multilayer substrate or in an internal wiring within the multilayer substrate. In the case that the thin film resistor is formed within the multilayer substrate, it is possible to reduce a mounting area on a substrate surface without changing the thickness of the multilayer substrate, with the result that it is very effective in miniaturize the mounting board.

The formation of the thin film resistor within a circuit board can be realized by a method disclosed in Japanese Patent Application No. Heisei 10-170313 published as JP-2000-013016-A in which a resistor thin film is deposited on a substrate, and a wiring conductor film is deposited, and then, the resistor thin film and the wiring conductor film are patterned by photolithography, or alternatively by a method in which a resistor thin film is deposited on a substrate and then patterned by photolithography, and thereafter a wiring conductor film is formed, or furthermore, a method in which a resistor thin film is deposited on a substrate having a wiring conductor film formed thereon, and then patterned by photolithography. However, the formation of the thin film resistor is in no way limited to only these methods.

Figure 2:
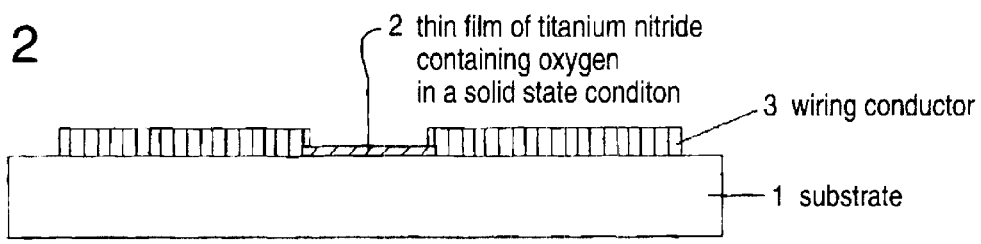
FIG. 2 is a view similar to that shown in FIG. 1 but illustrating a second embodiment of the thin film resistor in accordance with the present invention.
Figure 3:
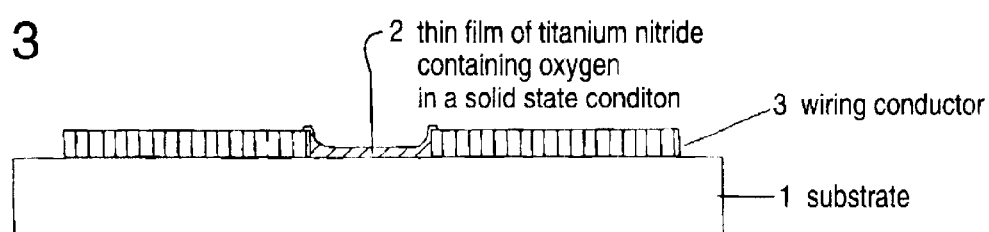
FIG. 3 is a view similar to that shown in FIG. 1 but illustrating a third embodiment of the thin film resistor in accordance with the present invention.

Now, referring to FIGS. 1, 2 and 3, there are shown diagrammatic sectional views of the thin film resistor in accordance with the present invention which is formed of a thin film of titanium nitride containing oxygen in a solid solution condition and which is formed on a substrate in accordance with the three methods as mentioned above. In these figures, the reference number 1 designates a substrate, which represents a circuit board or an intermediate layer in a multilayer circuit board. The reference number 2 indicates a thin film of titanium nitride containing oxygen in a solid solution condition. The reference number 3 shows a wiring conductor, and the reference number 4 denotes a resistor which is formed of the thin film of titanium nitride containing oxygen in the solid solution condition and which functions as a resistor.

According to the first method, as shown in FIG. 1, the thin film 2 of titanium nitride containing oxygen in the solid solution condition is deposited on the substrate 1, and then a wiring conductor film 3 is deposited, and then, the thin film 2 and the wiring conductor film 3 are sequentially patterned by photolithography, so that the thin film 2 which is not covered with the wiring conductor film 3, functions as the resistor 4.

According to the second method, as shown in FIG. 2, the thin film 2 of titanium nitride containing oxygen in the solid solution condition is deposited on the substrate 1, and then, patterned by photolithography, to form a thin film resistor. Thereafter, a wiring conductor 3 is formed and patterned so that the wiring conductor 3 is contact with each end of the thin film resistor.

According to the third method, as shown in FIG. 3, a wiring conductor film is deposited on the substrate 1 and then patterned to form a wiring conductor 3. Thereafter, the thin film 2 of titanium nitride containing oxygen in the solid solution condition is deposited on the substrate 1 having the wiring conductor film 3 formed thereon, and then patterned by photolithography so that the each end of the thin film resistor is contact with a corresponding end of the wiring conductor 3.

Figure 10:
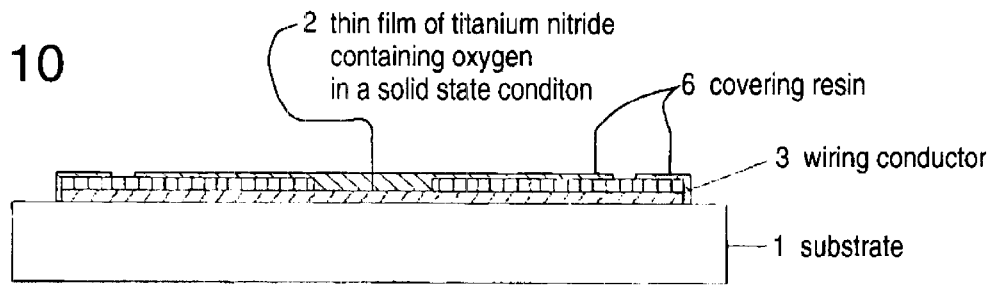
FIG. 10 is a diagrammatic sectional view of a fourth embodiment of the thin film resistor in accordance with the present invention which is formed of a thin film of titanium nitride containing oxygen in a solid solution condition and which is formed on a substrate and covered with a covering resin layer.
Figure 11:
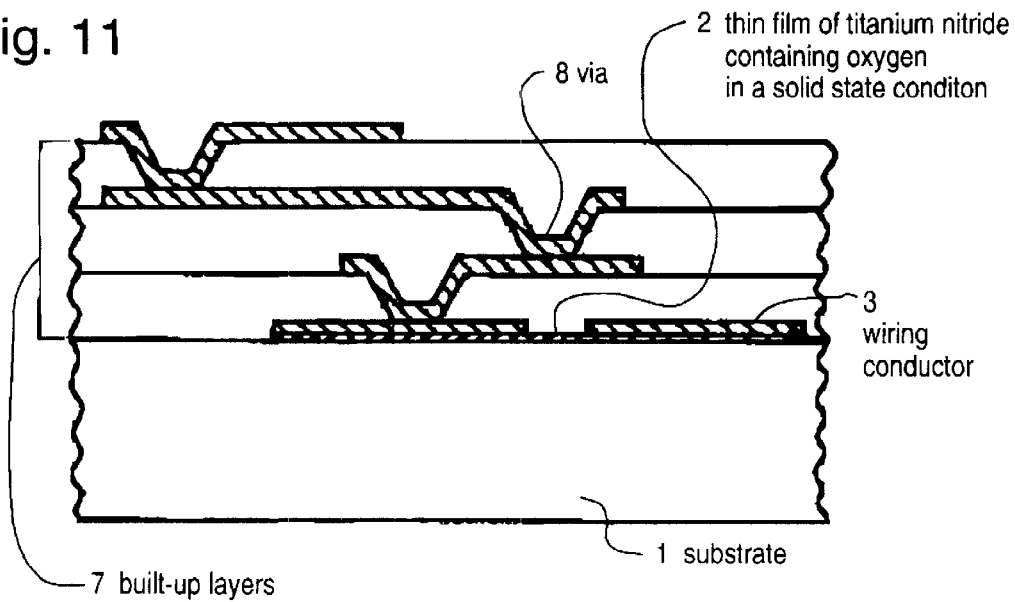
FIG. 11 is a diagrammatic sectional view of a fifth embodiment of the thin film resistor in accordance with the present invention which is formed of a thin film of titanium nitride containing oxygen in a solid solution condition and which is formed in a multilayer circuit substrate.

In the case of forming the thin film resistor in an internal wiring within the multilayer substrate, as shown in FIG. 10, a covering resin layer 6 is formed on the thin film resistor formed on the substrate 1 as shown in FIGS. 1, 2 and 3, so that a built-up circuit board is formed. Alternatively, one or more upper substrates are sequentially laminated on the thin film resistor formed on the substrate 1 as shown in FIGS. 1, 2 and 3, so that as shown in FIG. 11, a built-up layer 7 are formed on the substrate 1 to constitute a multilayer circuit board. In this example, a via hole 8 is formed for interlayer-connection.

For forming the thin film resistor in accordance with the present invention, a reactive sputtering is preferred which uses a titanium target and a process gas which is composed of a mixed gas including at least a nitrogen gas and a gas which contains an oxygen element. For the sputtering, a DC magnetron sputtering and a RF sputtering are preferred. For the gas which contains the oxygen element, an oxygen gas or a water vapor are preferred. In addition, it is possible to enlarge a deposition rate by adding an argon gas.

Furthermore, the composition of the thin film resistor in accordance with the present invention can be controlled by controlling the flow rate of respective gases and also a gas pressure, a substrate temperature and a sputtering power in the sputtering. Particularly, the gas pressure and the substrate temperature in the sputtering are important since these factors give a large influence on the film quality and the residual stress of the thin film. The gas pressure is preferred to be 1 to 10 mTorr, and the substrate temperature is preferred to be not greater than 500 degrees Celsius, more preferably, 100 to 250 degrees Celsius. However, the gas pressure and the substrate temperature are in no way limited to only these values. It is possible to control the partial pressure of the gas which contains the oxygen element, in place of the flow rate of the gas which contains the oxygen element.

As another method, the thin film resistor in accordance with the present invention can be formed by depositing a film on a water-deposited substrate by means of a reactive sputtering using a titanium target and a process gas which contains at least a nitrogen gas. In this case, the composition of the thin film resistor can be controlled by controlling the control of the gas pressure, the substrate temperature and the sputtering power in the sputtering, similarly to the first mentioned sputtering, and by controlling the partial pressure of the water vapor. In this connection, if water is included in a sputtering chamber, it is not necessary to deposit the water on the substrate, and it is sufficient if the partial pressure of the water vapor is controlled.

Thus, the resistance value and the temperature coefficient of resistance can be controlled by controlling the composition of the thin film resistor.

Now, specific embodiments of the thin film resistor in accordance with the present invention will be described.

As the substrate 1, a 5-inch silicon wafer having an oxide film formed on a surface thereof and a 100 mm-square FR-5 printed circuit board having a surface coated with an epoxy resin film were used. The oxide film formed on the surface of the silicon wafer is required as an insulating film, and the epoxy resin film coated on the FR-5 board is required to absorb concavo-convex in the surface of the printed circuit FR-5 board. As the epoxy resin, an epoxy acrylate resin having a fluorene skeleton, which is excellent in surface planarization and in electric characteristics for an electric insulator, as disclosed in Japanese Patent Application Pre-examination Publication No. JP-09-214141-A.

For the above mentioned substrate, a thin film of titanium nitride containing oxygen in a solid solution condition was deposited in a sputter-up type in-line DC magnetron sputtering machine by a reactive sputtering using a titanium target and introducing a nitrogen gas and an oxygen gas as a process gas. After a chamber of the sputtering machine was evacuated to a vacuum of not greater than $9.9 \times 10^{-7}$ Torr, a chamber pressure was adjusted in a deposition time to 3 mTorr by controlling an orifice throttle while supplying the nitrogen gas and the oxygen gas at the flow rate of 5.0 sccm and 0.1 to 0.5 sccm, respectively. The substrate temperature was 150 degrees Celsius; the substrate moving velocity above the target was 100 to 500 mm/lnin; and the sputtering power was 2.0 kW and 4.5 kW.

Figure 4:
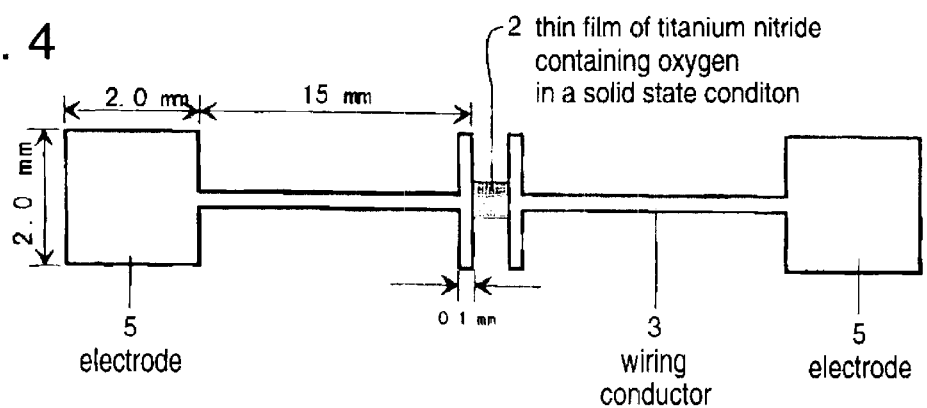
FIG. 4 is a pattern diagram illustrating a plan view of the thin film resistor in accordance with the present invention formed of a thin film of titanium nitride containing oxygen in a solid solution condition.

After these substrate was cut into 10 mm square, a composition analysis based on a Rutherford backward scattering spectrum (RBS), a resistance measurement based on a four-probe method, and a thin film structure analysis based on an X-ray diffraction (XRD) were conducted and evaluated. In addition, the temperature coefficient of resistance was calculated by forming the thin film resistor having the sectional structure shown in FIG. 1, and measuring a DC resistance at −55 degrees Celsius, at 20 degrees Celsius and at 150 degrees Celsius in a constant temperature chamber. A plan shape of the thin film resistor used for the measurement of the temperature coefficient of resistance is shown in FIG. 4. A size of the thin film resistor is 0.8mrn square, and the width of the wiring conductor 3 is 50 $\mu$m.

Furthermore, the film thickness of the thin film resistor having the plan pattern shown in FIG. 4 was measured by a contact needle type film thickness meter.

The thin film resistor having the plan pattern shown in FIG. 4 was formed in the following process: After a thin film of titanium nitride containing oxygen in a solid solution condition was deposited on a 5-inch silicon wafer having an oxide film formed on a surface thereof and a 100 mm-square printed circuit board FR-5 having a surface coated with an epoxy resin film, by the above mentioned process, copper was succeedingly sputtered. This copper sputtering was conducted using a copper target and maintaining the chamber pressure at 3 mTorr while supplying argon at the flow rate of 50sccm with the power of 2.5 kW. Thereafter, a photoresist was deposited and patterned, and a copper plating was conducted using the patterned photoresist as a mask, so that electrodes and wiring conductors were formed. Then, the patterned photoresist was removed, and the copper sputtering film was etched with a mixed aqueous solution of sulfuric acid and hydrogen peroxide. Thereafter, another photoresist was deposited and patterned, and the thin film of titanium nitride containing oxygen in the solid solution condition was etched with a mixed aqueous solution of ammonia and hydrogen peroxide, by using the patterned photoresist as a mask. Finally, the remaining patterned photoresist was removed.

Furthermore, a thin film of titanium nitride containing oxygen in the solid solution condition was formed on a water-deposited substrate, by a sputtering using only the nitrogen gas, and thereafter, samples were completed similarly to the above mentioned samples. Furthermore, the composition analysis, the resistance measurement, the structure analysis, the measurement of the temperature coefficient of resistance and the film thickness measurement were conducted.

Figure 8:
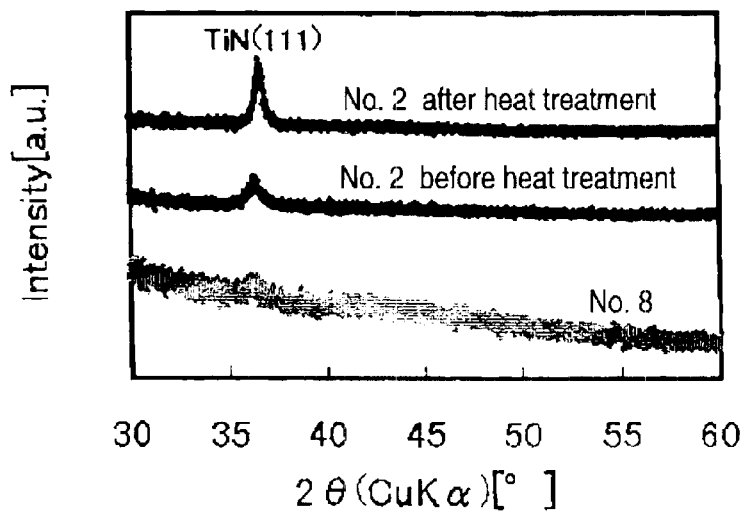
FIG. 8 is XRD diagrams of a thin film of titanium nitride containing oxygen in a solid solution condition, formed on a silicon substrate coated with an oxide film, and formed on a FR-5 board coated with an epoxy resin, and an XRD diagram of a thin film of titanium nitride containing oxygen in a solid solution condition, formed on a silicon substrate coated with an oxide film, after heat treatment.

The following table shows the result of the measurements. In the following table, the sample No. 1 to No. 6 are the samples which were formed on the oxide film coated silicon wafer by controlling the flow rate of the oxygen gas. The sample No. 7 to No. 10 are the samples which were formed on the FR-5 board coated with the epoxy acrylate resin having the fluorene skeleton, by controlling the flow rate of the oxygen gas. The sample No. 11 to No. 14 are the samples which were formed on the FR-5 board coated with the epoxy acrylate resin having the fluorene skeleton, by controlling the partial pressure of the water vapor.

solid solution condition. FIG. 8 shows the XRD pattern of the sample Nos. 2 and 8 and the XRD pattern of the sample No. 2 after it was heat-treated in a nitrogen atmosphere at 825 degrees Celsius for one minute. In all the samples, there was observed a diffraction line of the face interval of 0.245 to 0.246 nm at $2\theta=36.5$. to 36.6 degrees, which corresponds to a cubic crystal TiN(111) of a JCPDS card 38-1420. Since no diffraction line of titanium oxide and titanium oxynitride

| SAMPLE | | $O_2$ FLOW RATE | WATER VAPOR PARTIAL PRESSURE | POWER | VELOCITY | $Ti(N_{1-x/2}O_x)_y$ | | RESISTIVITY | TEMPERATURE COEFFICIENT OF RESISTANCE | FILM THICKNESS |
|---|---|---|---|---|---|---|---|---|---|---|
| No | SUBSTRATE | (sccm) | (Torr) | (kW) | (mm/m) | x | y | (mΩ · cm) | (ppm/° C.) | (nm) |
| 1 | SiO2/Si | 0.1 | — | 4.5 | 500 | 0.07 | 1.07 | 0.20 | 84.0 | 20 |
| 2 | SiO2/Si | 0.1 | — | 4.5 | 100 | 0.02 | 1.19 | 0.20 | 150.0 | 130 |
| 3 | SiO2/Si | 0.1 | — | 2.0 | 500 | 0.22 | 1.13 | 0.80 | 8.1 | 12 |
| 4 | SiO2/Si | 0.1 | — | 2.0 | 100 | 0.03 | 1.13 | 0.34 | 96.0 | 60 |
| 5 | SiO2/Si | 0.3 | — | 4.5 | 500 | 0.35 | 1.13 | 3.10 | −25.0 | 20 |
| 6 | SiO2/Si | 0.5 | — | 4.5 | 500 | 0.44 | 1.06 | 15.00 | −98.0 | 20 |
| 7 | Epoxy/FR-5 | 0.1 | — | 4.5 | 500 | 0.12 | 1.04 | 0.37 | 48.0 | — |
| 8 | Epoxy/FR-5 | 0.1 | — | 4.5 | 100 | 0.09 | 1.08 | 0.35 | 79.0 | — |
| 9 | Epoxy/FR-5 | 0.3 | — | 4.5 | 500 | 0.26 | 1.09 | 1.10 | −12.0 | — |
| 10 | Epoxy/FR-5 | 0.5 | — | 4.5 | 500 | 0.45 | 1.09 | 20.00 | −131.0 | — |
| 11 | Epoxy/FR-5 | 0 | $1 \times 10^{-7}$ | 4.5 | 500 | 0.10 | 1.07 | 0.40 | 56.0 | — |
| 12 | Epoxy/FR-5 | 0 | $1 \times 10^{-7}$ | 4.5 | 100 | 0.10 | 1.05 | 0.39 | 68.0 | — |
| 13 | Epoxy/FR-6 | 0 | $4 \times 10^{-7}$ | 4.5 | 500 | 0.28 | 1.10 | 1.40 | −20.5 | — |
| 14 | Epoxy/FR-5 | 0 | $8 \times 10^{-7}$ | 4.5 | 500 | 0.42 | 1.08 | 5.30 | −65.0 | — |

Here, in the examples in which the thin film resistor was formed on the FR-5 board coated with the epoxy acrylate resin having the fluorene skeleton, the film thickness of the thin film resistor could not be measured because of the concavo-convex of the surface of the FR-5 board Therefore, the resistivity was calculated under the assumption that the film thickness is the same as that of the film which was formed on the oxide film coated silicon wafer under the same sputtering power and the same substrate moving velocity.

Figure 5:
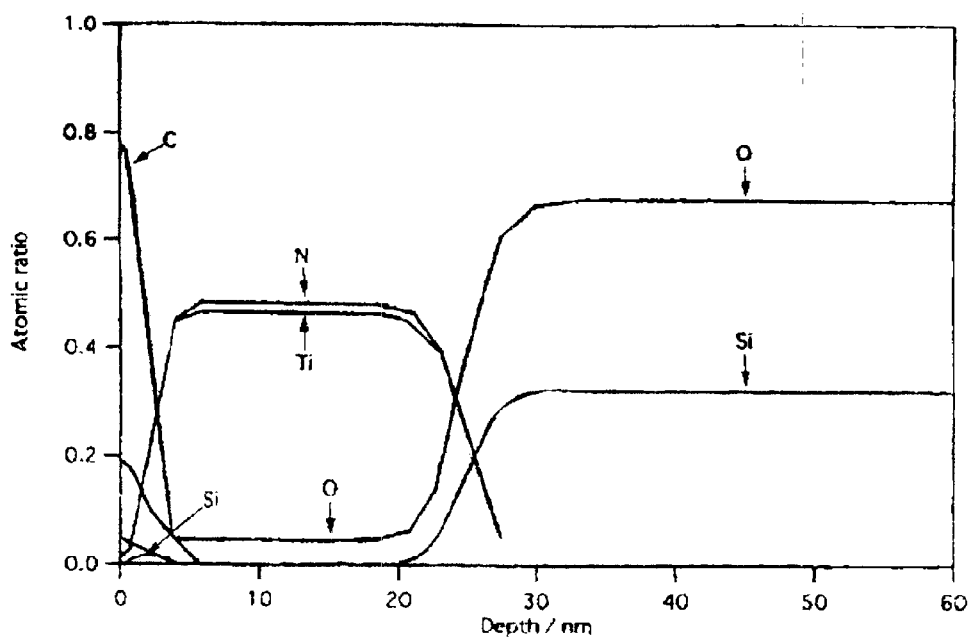
FIG. 5 is a graph illustrating the result of RBS measurement in the thin film resistor in accordance with the present invention which is formed of a thin film of titanium nitride containing oxygen in a solid solution condition and which is formed on a silicon substrate coated with an oxide film.

Referring to FIG. 5, there is shown the measured value of the RBS of the sample No. 1. The axis of abscissas shows the depth from the surface, and the axis of ordinates indicates an atomic ratio. From the ratio of Ti, N and O based on this RBS analysis, the composition of the thin film in all the samples could be expressed by $Ti(N_{1-x/2}O_x)y$. In the samples shown in the table, it was $0.02 \leq y \leq 0.45$, and $1.04 \leq y \leq 1.19$. Here, taking a measurement error into consideration, it can be concluded $0<x \leq 0.5$, and $0.8 \leq y \leq 1.4$.

Figure 6:
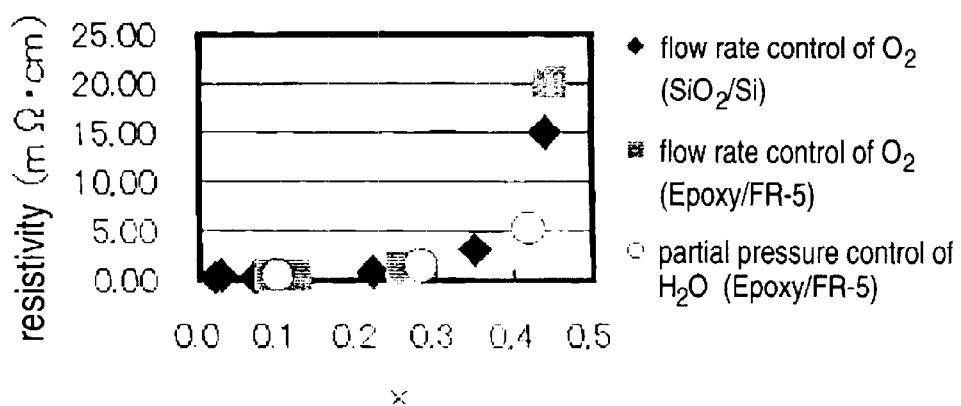
FIG. 6 is a graph showing the resistivity of $Ti(N_{1-x/2}O_x)y$ depending upon the amount of oxygen in a solid solution condition.
Figure 7:
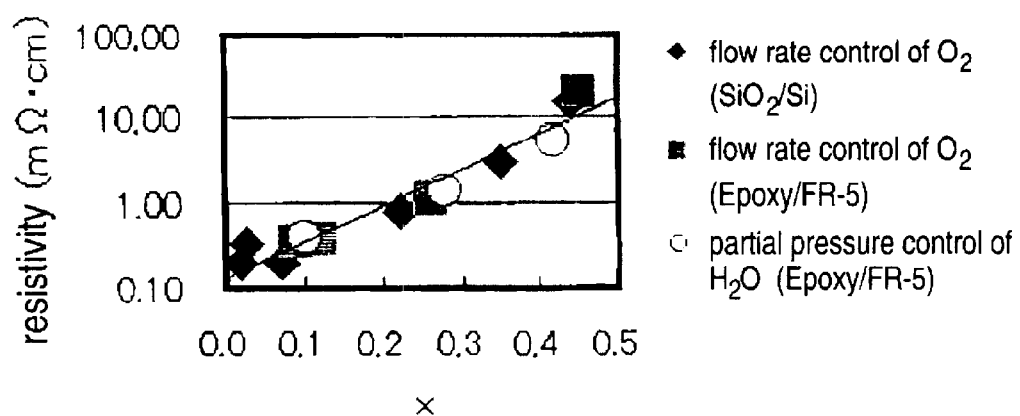
FIG. 7 is a graph showing the resistivity of $Ti(N_{1-x/2}O_x)y$ depending upon the amount of oxygen in a solid solution condition.

Referring to FIG. 6, there is shown a graph showing a relation between the factor "x" and the resistivity of $Ti(N_{1-x/2}O_x)y$. The resistivity abruptly increases with increase in the amount of oxygen in the solid solution condition. The resistivity of these samples was from 0.2 Ω·cm to 20 Ω·cm. FIG. 7 shows the relation between the factor "x" and the resistivity of $Ti(N_{1-x/2}O_x)y$, indicating the resistivity in an exponential scale. It would be seen from FIG. 7 that the plotted line is linear in the exponential scale, and therefore, the resistivity exponentially increases with increase in the amount of oxygen in the solid solution condition. Therefore, it would be understood that it is possible to control the resistivity value of $Ti(N_{1-x/2}O_x)y$, by controlling the amount of oxygen in the solid solution condition. On the other hand, dependency between the factor "y" of $Ti(N_{1-x/2}O_x)y$ and the resistivity could not be recognized.

Referring to FIG. 8, there are shown XRD patterns of the formed thin film of titanium nitride containing oxygen in the was found, it is considered that oxygen is included in a solid solution condition in TiN. This indicates the composition $Ti(N_{1-x/2}O_x)y$ which is the result of the RBS measurement.

In this connection, it can be considered that in the case of y>1, there is a defect of Ti, and in the case of y<1, there is a defect of N and O. Furthermore, in the sample No. 2, since the diffraction line corresponding to the cubic crystal TiN (111) was sharpened by the heat treatment, it can be considered that crystallization of $Ti(N_{1-x/2}O_x)y$ was advanced with the heat treatment. Accordingly, $Ti(N_{1-x/2}O_x)y$ of the sample No. 2 as deposited and before the heat treatment can be considered to be a complex of amorphous $Ti_{(1-x/2}O_x)y$ and crystalline $Ti_{(1-x/2}O_x)y$.

On the other hand, in the sample of No. 8 formed on the FR-5 board coated with the epoxy acrylate resin having the fluorene skeleton, the intensity of the diffraction line corresponding to the cubic crystal TiN(111) is small in comparison with that in the sample formed on the oxide film coated silicon wafer. Accordingly, it can be also considered that the film formed on the FR-5 board coated with the epoxy acrylate resin having the fluorene skeleton contains a high proportion of amorphous $Ti(N_{1-x/2}O_x)y$, in comparison with that in the film formed on the oxide film coated silicon wafer. $Ti(N_{1-x/2}O_x)y$ of the sample No. 2 was formed with the substrate moving velocity of 100 mm/nin and the sputtering power of 4.5 kW, and has the film thickness of 130 nm. Since the sample No. 8 was formed with the same substrate moving velocity and the same sputtering power as those in the sample No. 2, the film thickness of the sample No. 8 can be considered to be 130 nm. In the samples formed on the oxide film coated silicon wafer other than the sample No. 2, only the diffraction line corresponding to TiN(111) could be observed, similarly to the sample No. 2, but the thinner the film thickness is, the intensity of the diffraction line became small. In particular, the diffraction line was not almost observed in the sample No. 3. In the samples formed on the FR-5 board coated with the epoxy acrylate resin having the fluorene skeleton, other than the sample No. 8, in the sample No. 12 which was formed with the same substrate moving velocity and the same sputtering power as those in the sample No. 8, a XRD pattern was similar to that in the sample No. 8, but the diffraction line was not observed in the other samples.

From the above analysis result, it can be considered that amorphous Ti($N_{1-x/2}O_x$)y was formed on the FR-5 board coated with the epoxy acrylate resin having the fluorene skeleton. However, it can be also considered that the diffraction line was not observed because the film thickness is small and because the crystal gain size is small. Accordingly, it can be considered that Ti($N_{1-x/2}O_x$)y formed on the FR-5 board coated with the epoxy acrylate resin having the fluorene skeleton is a complex of crystalline condition and amorphous condition, or amorphous, or polysilicon composed of microcrystals.

Figure 9:
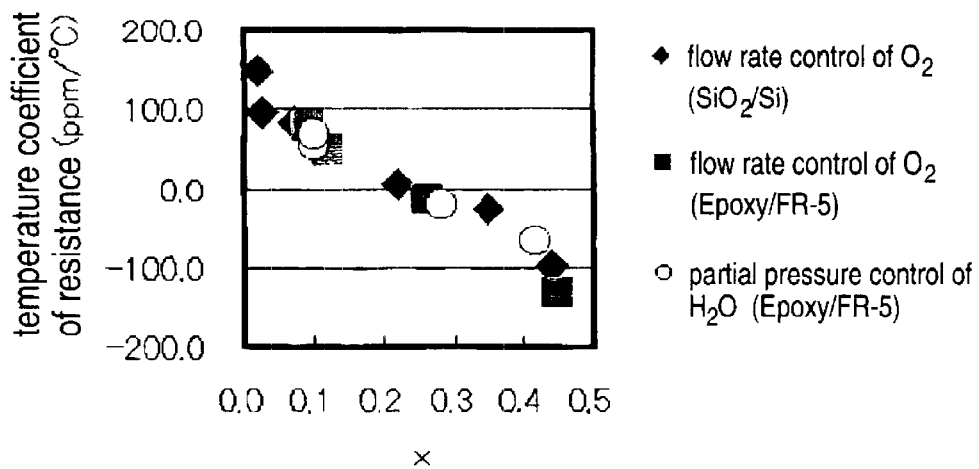
FIG. 9 is a graph showing the temperature coefficient of resistance of $Ti(N_{1-x/2}O_x)y$ depending upon the amount of oxygen in a solid solution condition.

Referring to FIG. 9, there is shown a graph showing the temperature coefficient of resistance of Ti($N_{1-x/2}O_x$)y depending upon the amount of oxygen in a solid solution condition, which was obtained by measuring the pattern shown in FIG. 4 having the sectional view shown in FIG. 1. In the range of $0.035 \leq x \leq 50.44$, the temperature coefficient of resistance of Ti($N_{1-x/2}O_x$)y shows an excellent characteristics in the range of ±100 ppm/degree Celsius. In particular, in the case of x=0.25, it was found out that the temperature coefficient of resistance can be controlled to be almost 0 (zero). The temperature coefficient of resistance of the thin film resistor of the pattern shown in FIG. 4 was measured for five samples of a 0.8 mm square thin film resistor. Furthermore, the resistance value was measured for six samples of each of a 0.1 mm square thin film resistor, a 0.2 mm square thin film resistor, a 0.4 mm square thin film resistor, a 0.8 mm square thin film resistor and a 1.6 mm square thin film resistor (30 samples in total). As a result, the temperature coefficient of resistance of all the samples shown in the table was recognized to be within an error of ±5%, and an error of the resistance value was ±2%.

Further, as shown in FIG. 10, a covering resin layer 6 was formed on the thin film resistors formed on the silicon substrate and the FR-5 board which were used for the measurement of the temperature coefficient of resistance. The covering resin layer 6 was formed of photosensitive epoxy acrylate resin having a fluorene skeleton, and was patterned to have an opening only on the measuring electrode pad 5. The covering resin layer 6 was cured in a nitrogen atmosphere at 200 degrees Celsius for 30 minutes. The resistance values of each sample was measured. Comparing the resistance value with the resistance value before the covering resin layer 6 was formed, the change of the resistance value was not greater than 0.5%. Accordingly, it can be said that the thermal stability of the thin film resistor of Ti($N_{1-x/2}O_x$)y is very excellent.

In addition, if the opening formed in the covering resin layer 6 on the measuring electrode pad 5 as shown in FIG. 10 is used as a via hole, a built-up substrate or a multilayer circuit board internally including the resistor can be easily fabricated as shown FIG. 11.

As mentioned above, according to the present invention, by forming a thin film resistor by a thin film of titanium nitride containing oxygen in a solid solution condition, it is possible to form a thin film resistor having an excellent thermal stability and a high precision of resistance value, by a simple process. In addition, it is also possible to provide a method for forming a thin film resistor which is formed of a thin film of titanium nitride containing oxygen in a solid solution condition, and which can assume a resistance value in a wide range, by a reactive-sputtering using a titanium target and a process gas composed of a mixed gas including a nitrogen gas and a gas which contains an oxygen element, or alternatively, by forming the film on a water-deposited substrate by a reactive-sputtering using a titanium target and a process gas including at least a nitrogen gas. Furthermore, it is also possible to form a substrate internally including a thin film resistor, by using the thin film of titanium nitride containing oxygen in a solid solution condition, in accordance with the present invention.

The invention has thus been shown and described with reference to the specific embodiments. However, it should be noted that the present invention is in no way limited to the details of the illustrated structures but changes and modifications may be made within the scope of the appended claims.

What is claimed is:

1. A thin film resistor comprising:
a thin film of titanium nitride comprising oxygen in a solid solution condition,
wherein said titanium nitride comprising oxygen in said solid solution condition is expressed by a chemical formula given by:

Ti($N_{1-x/2}O_x$)y where 0<x<0.5, and 0.8<y<1.4.

2. A thin film resistor claimed in claim 1, wherein x=0.25 and wherein a temperature coefficient of resistance is about zero.

3. A thin film resistor claimed in claim 1 wherein said titanium nitride comprising oxygen in said solid solution condition is amorphous.

4. A thin film resistor claimed in claim 1 wherein said titanium nitride comprising oxygen in said solid solution condition is in a mixed condition of crystal and amorphousness.

5. A thin film resistor claimed in claim 1, wherein said thin film of titanium nitride comprising oxygen in said solid solution condition has resistivity in a range of 0.1 to 100 mΩ·cm.

6. A thin film resistor claimed in claim 1, wherein said titanium nitride comprising oxygen in said solid solution condition has a temperature coefficient of resistance in a range of +100 ppm/degree Celsius, in a temperature range from −55 degrees Celsius to +150 degrees Celsius.

7. A thin film resistor claimed in claim 1, wherein said thin film of titanium nitride comprising oxygen in said solid solution condition is formed on a surface of a circuit board.

8. A thin film resistor claimed in claim 1, wherein said titanium nitride comprising oxygen in said solid solution condition is formed in a multilayer circuit board.

9. A thin film resistor claimed in claim 1, wherein a resistivity of said thin film resistor is increased by increasing an amount of oxygen in said titanium nitride.

10. A thin film resistor claimed in claim 1, wherein a temperature coefficient of resistance in said thin film resistor is selectively variable depending upon an amount of oxygen in said titanium nitride.

11. A thin film resistor claimed in claim 1, wherein a resistivity of said thin film resistor is unaffected by a heat treatment.

12. A thin film resistor claimed in claim 1, wherein said thin film resistor comprises one of an amorphous structure, a composite of a crystal and an amorphous structure, a polycrystalline structure, and a single crystal structure.

13. A thin film resistor claimed in claim 1, wherein said thin film resistor has a thickness of about 130 nm.

14. A thin film resistor claimed in claim 1, wherein said thin film resistor is formed between two electrodes and is coupled to each said electrode by a wiring conductor.

15. A thin film resistor claimed in claim 1, wherein said thin film resistor comprises one of a 0.1 nm square thin film resistor, a 0.2 mm square thin film resistor, a 0.4 mm square thin film resistor, a 0.8 mm square thin film resistor and a 1.6 mm square thin film resistor.

* * * * *